(12) United States Patent
Ohminami

(10) Patent No.: US 7,278,587 B2
(45) Date of Patent: Oct. 9, 2007

(54) THERMAL TREATMENT APPARATUS AND THERMAL TREATMENT METHOD

(75) Inventor: Nobuyuki Ohminami, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 514 days.

(21) Appl. No.: 10/484,018

(22) PCT Filed: Jul. 18, 2002

(86) PCT No.: PCT/JP02/07335

§ 371 (c)(1),
(2), (4) Date: Jul. 20, 2004

(87) PCT Pub. No.: WO03/009358

PCT Pub. Date: Jan. 30, 2003

(65) Prior Publication Data

US 2004/0238649 A1    Dec. 2, 2004

(30) Foreign Application Priority Data

Jul. 19, 2001    (JP) .............................. 2001-220125

(51) Int. Cl.
*F23N 1/08* (2006.01)
*G05D 15/00* (2006.01)
*G05D 23/00* (2006.01)
*F25B 29/00* (2006.01)

(52) U.S. Cl. .................. 236/1 C; 236/20 R; 236/25 R; 219/494; 219/497; 165/253

(58) Field of Classification Search ................ 236/1 C, 236/20 R, 25 R; 219/494, 497, 486, 483; 165/253; 373/136; 392/417
See application file for complete search history.

(56) References Cited

U.S. PATENT DOCUMENTS 5,616,264 A    4/1997    Nishi et al.

FOREIGN PATENT DOCUMENTS

| JP | 01-282619 | 11/1989 |
| JP | 03-001066 | 1/1991 |
| JP | 06-053141 | 2/1994 |
| JP | 07-135182 | 5/1995 |
| JP | 08-124868 | 5/1996 |

OTHER PUBLICATIONS

Translation of the International Preliminary Examination Report mailed May 13, 2004 in corresponding PCT Application No. PCT/JP2002/007335.

*Primary Examiner*—Chen Wen Jiang
(74) *Attorney, Agent, or Firm*—Nixon & Vanderhye P.C.

(57) ABSTRACT

A thermal treatment apparatus and method of thermal treatment are provided wherein the apparatus includes a treatment chamber used to thermally treat an object material held therein, fluid passages formed so as to extend along an outer surface of the treatment chamber, a heating means for the thermal treatment operation placed in the fluid passages, a fluid passing means for passing a fluid through the fluid passages while bringing the fluid into contact with heating surfaces of the heating means, and a control means for controlling the temperature and flow rate of the fluid passing through the fluid passages in at least one period of time during the thermal treatment operation, the fluid passing means further includes a plurality of blast rate variable fans arranged in parallel with the fluid passage and having mutually different flow rates.

16 Claims, 14 Drawing Sheets

PRIOR ART

THERMAL TREATMENT APPARATUS AND THERMAL TREATMENT METHOD

This application is the U.S. national phase of international application PCT/JP02/07335 filed Jul. 18, 2002 which designated the U.S., the entire contents of which are hereby incorporated by reference.

FIELD OF THE INVENTION

This invention relates to a thermal treatment apparatus and a thermal treatment method using the same apparatus, and more particularly to a thermal treatment apparatus and a thermal treatment method which are used to form a film and the like on a semiconductor substrate in the production of semiconductors.

BACKGROUND ART

In general, in the production of a semiconductor apparatus, a step of forming a thin film, such as a polysilicon film, an oxide film, a nitride film and the like on a semiconductor substrate by using a thermal treatment film forming apparatus, a CVD apparatus, and the like (which will hereinafter be referred generally to a thermal treatment apparatus) is being used in many cases.

These thermal treatment steps have demanded that the steps be carried out at a lower temperature as the refining of a device progresses, and that the treatment time be shortened for the purpose of improving the productivity of a semiconductor device.

The Japanese Patent Application No. Hei 6-53141 (1994) discloses a thermal treatment apparatus which has an air cooling unit as shown in FIG. 10, and which is designed so as to improve the though-put thereof.

Referring to FIG. 10, a thermal treatment apparatus 100 includes a treatment chamber 3 for subjecting semiconductor wafers 1 held on a boat 2 to a thermal treatment, an insulating member 7 forming fluid passages 8, 9 between the insulating member 7 and treatment chamber 3 and covering an outer side of the treatment chamber, a heater 6 provided in the fluid passages 8, 9 and adapted to heat the interior of the treatment chamber 3, a blower 21 (air cooling unit) adapted to pass a fluid 14 (air) through the fluid passages 8, 9 so that the fluid contacts a heating surface of the heater 6, and switch valves 19 provided at inlets of the fluid passages 8, 9. The blower 21 is driven at a predetermined blast rate and cools the interior of the fluid passages 8, 9.

A maximum temperature in the treatment chamber 3 at the time of subjecting the semiconductor wafers 1 to a thermal treatment differs depending upon the content of the treatment. This temperature can be divided into, for example, a low temperature (100 to 500° C.), an intermediate temperature (500 to 900° C.) and a high temperature (900 to 1300° C.).

In order to take out the wafers 1 from the treatment chamber 3, it is necessary that the treatment chamber 3 be cooled. In the thermal treatment apparatus 100, the temperature in the treatment chamber 3 can be reduced at a rate of around −30°/min during the cooling time which is after the treatment operation conducted at an intermediate temperature (for example, about 800° C.), so that the through-put is improved greatly as compared with that in a thermal treatment apparatus (in which a temperature reduction rate based on a natural cooling operation is around −5° C./min) not provided with a cooling unit.

The switch valve 19 is adapted to be opened at the cooling time only and discharge high-temperature exhaust gas. At the time other than the cooling time, this valve 19 is closed so as to prevent the heat from being discharged wastefully.

The Japanese Patent Application No. Hei 7-135182 (1995) discloses as shown in FIG. 11 a thermal treatment apparatus 200 having an air cooling unit similar to that referred to above, and provided with an exhaust gas circulating passages in which heat exchangers 20 are inserted.

In the thermal treatment apparatus 200, a high-temperature exhaust gas discharged into an exhaust gas circulating passages is cooled in the heat exchangers 20, and the resultant gas is returned to the treatment chamber 3 to be reutilized.

In the thermal treatment apparatus 100 and thermal treatment apparatus 200, the interior of the treatment chamber 3 can be cooled in a short period of time.

In these thermal treatment apparatuses, the air of around room temperature is made to flow in large quantities into the fluid passages 8, 9 after the thermal treatment operation in the treatment chamber 3 is completed. Therefore, when the interior of the treatment chamber 3 is in a high-temperature condition (for example, at around 1200° C.), there is the possibility that the heater 6 and treatment chamber 3 be broken due to sudden temperature variation.

Another problem is the overshooting of temperature occurring during a temperature increasing operation. In general, when the temperature in the treatment chamber 3 is increased at a high rate up to a set level at the time of starting a thermal treatment operation, the overshooting of temperature occurs. FIG. 12 shows an example of the overshooting of temperature.

In FIG. 12, a graph 1 shows temperature variation in the treatment chamber 3 in a case where the temperature is increased from 100° C. to 400° C. at +30° C./min.

In this case, the overshooting of +80° C. occurs with respect to the set temperature of 400° C., and the wafers in the treatment chamber 3 receive unnecessary heat. Moreover, in order to forward a reaction at the set temperature, it is necessary to wait for a decrease of the temperature to the set level, so that the through-put of the heat treatment apparatus lowers.

There is a method of lowering a rate of increasing the temperature in a stepped manner so as to prevent the occurrence of the overshooting of the temperature. A graph 2 in FIG. 12 shows temperature variation in the treatment chamber 3 in a case where the temperature therein is increased up to 400° by setting a set temperature in a stepped manner.

In this case, the time needed to complete a temperature increasing operation is prolonged. Consequently, an unnecessary thermal treatment is conducted in the same manner as mentioned above, so that the through-put of the thermal treatment apparatus also lowers in the same manner.

In order to carry out a device simulation, the overshooting of temperature is not taken into consideration in many cases. Therefore, a large difference occurs between the results of an operation of a practical device and those of a simulation of the device.

Namely, since there is a scatter of the overshooting of temperature in each thermal treatment apparatus, it is necessary to obtain data by conducting experiments. Therefore, a long period of time is required to utilize the data for a simulation.

Although the related art thermal treatment apparatus is thus superior in the temperature increasing rate, the time needed to reduce the increased temperature to a set level is long. This constituted an obstacle to the attainment of a stable thermal treatment process.

There is another problem of obtaining the stability of the temperature in the treatment chamber 3 during a thermal treatment operation.

FIG. 13 shows a record of the temperature in the treatment chamber 3 of a related art thermal treatment apparatus (especially, a diffusion furnace) in which the temperature in the treatment chamber 3 was increased from 450° C. to 700° C. at a temperature increasing rate of +3° C./min with the temperature in the treatment chamber from the time at which two hours elapsed (zero minute) after the temperature started being increased recorded.

FIG. 14 shows a record of the temperature in the treatment chamber 3 of a related art thermal treatment apparatus in which the temperature in the treatment chamber was reduced from 450° C. to 200° C. at a temperature reducing rate of −3° C./min with the temperature in the treatment chamber 3 from the time at which two hours elapsed (zero minute) after the temperature started being reduced recorded.

Although the temperature stability in a case where the interior of the treatment chamber 3 is maintained at intermediate and high temperatures is satisfactory as shown in FIG. 13, the temperature stability in a case where the interior of the treatment chamber 3 is maintained at a low temperature (for example, around 200° C.) is not satisfactory as shown in FIG. 14. Therefore, in order to conduct a low-temperature thermal treatment operation needed in a wiring setting step, it was necessary that a thermal treatment apparatus on which a special heater for a low-temperature thermal treatment operation be additionally prepared.

The present invention has been made so as to solve these problems encountered in the related art apparatus and method of this kind, and aims at providing a thermal treatment apparatus capable of speedily reducing a thermal treatment temperature to a set level, and having a high temperature-stability in a wide treatment temperature range.

DISCLOSURE OF THE INVENTION

According this invention, a thermal treatment apparatus is provided which includes a treatment chamber used to thermally treat an object material held therein, fluid passages formed along an outer surface of the treatment chamber, a heating means provided in the fluid passages and used to conduct a thermal treatment for the object material, a fluid passing means for bringing a fluid into contact with heating surfaces of the heating means and passing the fluid through the fluid passages, and a control means for controlling in at least one period of time during the thermal treatment for the object material a temperature and a flow rate of the fluid passing through the fluid passages.

Owing to the above-described structure provided with the fluid control means for controlling a temperature and a flow rate of the fluid passed through the fluid passages in at least one period of time during the thermal treatment for an object material, the temperature increasing and decreasing (i.e. cooling) rates can be heightened when a thermal treatment operation is carried out by the heating means, and the heat transmission from the heating means can be finely regulated. Accordingly, the converging of the thermal treatment temperature to a set level can be attained speedily, and a high temperature-stability can be obtained in a wider treatment temperature range. This causes the through-put of the apparatus to be improved.

Even when the interior of the treatment chamber is cooled from a high-temperature condition to an intermediate temperature condition, the fluid can be controlled so as not to cause a sudden temperature variation to occur in the treatment chamber, so that the treatment chamber is not broken.

The materials to be treated in the present invention include a semiconductor substrate (wafer) and the like but the materials are not limited to these.

The applied apparatuses of the thermal treatment apparatus according to the present invention include a CVD apparatus for laminating a thin film or an oxide film on an outer surface of a semiconductor substrate or diffusing impurities thereon, an oxide film forming apparatus and a diffusion apparatus.

The fluid passages in the present invention are passages for bringing a heating fluid or a cooling fluid into contact with an outer surface of the treatment chamber, and thereby giving and receiving heat between the interior of the treatment chamber and the exterior thereof. To be concrete, the fluid passages include passages formed between the outer surface of the treatment chamber and an outer wall, which is made of an insulating material, provided on the outer side of the treatment chamber.

The heating means in the present invention is preferably a heating means provided at the outer side thereof with a heating surface of a sufficient area contacting the fluid, and capable of transmitting heat to the fluid.

A gas, such as the air, or a liquid is used as the fluid in the present invention. Especially, when it is desired to heighten the cooling effect, a liquid, such as water is preferably used.

The control means in the present invention may be made of a control means including a temperature regulating means for cooling or heating the fluid, which passes through the fluid passages, at an upstream side of the fluid passages, a flow rate control means for controlling a flow rate of the fluid passing through the fluid passages, and a fluid controller adapted to detect the temperature in the treatment chamber or the object material to be treated and control the driving of the temperature regulating means and flow rate control means.

The flow rate control means may be made of flow rate control valves provided in the fluid passages.

The fluid passing means may be made of a blast rate variable fan or a liquid quantity variable pump. When the fluid passing means is made of a plurality of blast rate variable fans arranged in parallel with each other in the fluid passages and having flow rates different from each other, fine flow rate regulation can be attained.

The control means may be made of a means adapted to detect as a temperature measuring means, such as a thermocouple, the temperature of the interior of the treatment chamber or the object material to be treated, and ON-OFF control the heating means and temperature regulating means. When such a control means is used, a high temperature-stability can be obtained correspondingly to the condition of the object material stored in the treatment chamber, i.e. various fluctuations due to the kind, quantity and set temperature of the material to be treated and external causes.

When a program controlling operation and the like in which a temperature controlling operation is carried out on the basis of a program set in advance in this invention is carried out, the temperature measuring means may not be provided.

The control means has a first heating means provided in the portions of the interior of the fluid passages which are in the vicinity of the treatment chamber, and a second heating means for heating the fluid, which passes through the fluid passages, at the upstream side of the fluid passages. Since the first heating means can be switched to the second heating means, the temperature in the treatment chamber can be reduced without causing a sudden temperature variation to occur.

According to another aspect of the present invention, a thermal treatment method is provided which is adapted to conduct a thermal treatment for an object material by using a thermal treatment apparatus provided with a treatment chamber in which an object material stored therein is subject to a thermal treatment, fluid passages formed so as to extend along an outer surface of the thermal chamber, a heating means for thermal treatments placed in the fluid passages, a fluid passing means adapted to bring a fluid into contact with a heating surface of the heating means and pass the fluid through the fluid passages, and a control means for controlling the heating means and fluid passing means, wherein the control means gives a command to the fluid passing means so as to pass the fluid through the fluid passages while varying the temperature and flow rate of the fluid in at least one period of time during the thermal treatment operation for the object material.

The thermal treatment operation in this invention includes a temperature increasing period between the thermal treatment starting time and the time at which a preset treatment temperature is attained, a retention period in which a set temperature is retained in a predetermined range of levels, and a temperature decreasing period between the end of the retention period and the time of completion of the thermal treatment. In the thermal treatment, the controller detects the temperature of the interior of the treatment chamber or that of the object material being treated, and controls the temperature and flow rate of the fluid during at least one of these periods.

When the control means gives a command to the fluid passing means immediately before the attainment of a preset treatment temperature to have the fluid pass through the fluid passages, the heat excessively given so as to increase the temperature can be removed, so that the overshooting of temperature can be suppressed.

When the control means gives a command to the fluid passing means at the time of thermally treating an object material to have the fluid, which is controlled to, for example, −100° C. with respect to a set temperature for a thermal treatment operation, flow continuously. The thermal treatment temperature can be stabilized at the time of thermally treating the object material at a predetermined temperature.

Especially, when a fluid controlled to an extremely low temperature (for example, around −100 to 100° C.) is continuously made to flow during a low-temperature thermal treatment operation, the thermal treatment temperature can be stabilized.

Furthermore, the control means gives a command to the heating means so as to increase the temperature until the time immediately before the time at which a preset thermal treatment temperature is attained, at an average temperature increasing rate of not lower than +10°/min, and so as to increase the temperature with the overshooting of the temperature with respect to the set temperature at not higher than +1° C. Therefore, the time needed to stabilize the temperature, i.e. the time needed to lower the temperature from an overshooting level to a set level, or the time needed to attain the set level when the rate of increase in the temperature is lowered so that the temperature does not exceed the set level can be shortened.

The thermal treatment apparatus according to this invention can be used for a thermal treatment operation conducted to form a thin film on a semiconductor substrate.

BEST MODE FOR CARRYING OUT THE INVENTION

Figure 1:
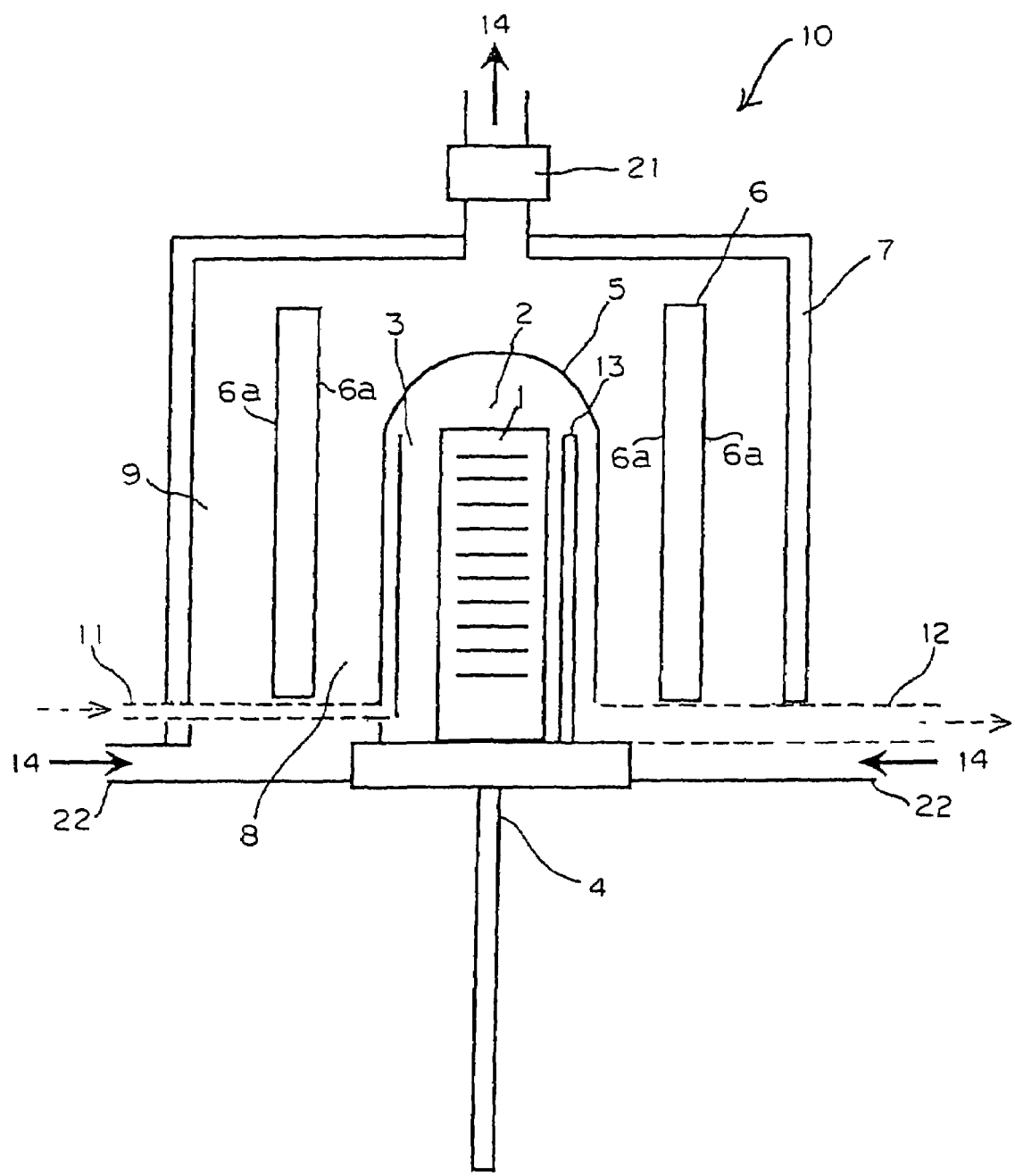
FIG. 1 is a sectional view showing the basic construction of the thermal treatment apparatus in a mode 1 of embodiment of the present invention.

The modes of embodiments of the present invention will now be described on the basis of what are shown in the drawings but the present invention is not limited to these embodiments.

MODE 1 OF EMBODIMENT

FIG. 1 is a sectional view showing the basic construction of the thermal treatment apparatus in a mode 1 of embodiment of the present invention.

As shown in FIG. 1, a thermal treatment apparatus 10, a diffusion furnace is provided with a boat 2 for use in placing semiconductor wafers 1 thereon, a treatment chamber 3 for thermally treating therein the semiconductor wafers 1 at a desired temperature, an elevator mechanism 4 for inserting and withdrawing the boat 2, on which the semiconductor wafers 1 are placed, into and from the treatment chamber 3, a heater 6 provided so as to enclose side portions of an outer wall 5 of the treatment chamber 3 for the purpose of setting the temperature of the interior of the treatment chamber 3 to a desired level, and an insulating member 7 provided so as to enclose a circumference of the heater 6 and an upper portion of an outer wall 5 of the treatment chamber 3.

Between the treatment chamber 3 and insulating member 7, fluid passages 8, 9 are formed for use in passing a fluid 14 (air) therethrough while bringing the fluid into contact with heating surfaces 6a formed on front and rear sides of the heater 6.

A blower 21 is provided in downstream side portions (upper portion of the drawing) of the fluid passages 8, 9. The blower 21 is capable of varying a blast rate, and can suck the air in the treatment chamber from fluid inlets 22 into the fluid passages 8, 9, pass the sucked air therethrough while bringing the air into contact with the heating surfaces 6a, and thereafter discharge the air to the outside of the thermal treatment apparatus 10.

In the vicinity of the fluid inlet 22, an introduction port 11 for introducing a gas into the treatment chamber 3, and a discharge port 12 for discharging the gas in the treatment chamber 3 to the outside thereof are provided.

The treatment chamber 3 is provided with a thermocouple 13 for measuring the temperature therein. The thermocouple 13 is connected to a temperature control means (not shown) for controlling the temperature in the treatment chamber 3 on the basis of a set level.

Figure 2:
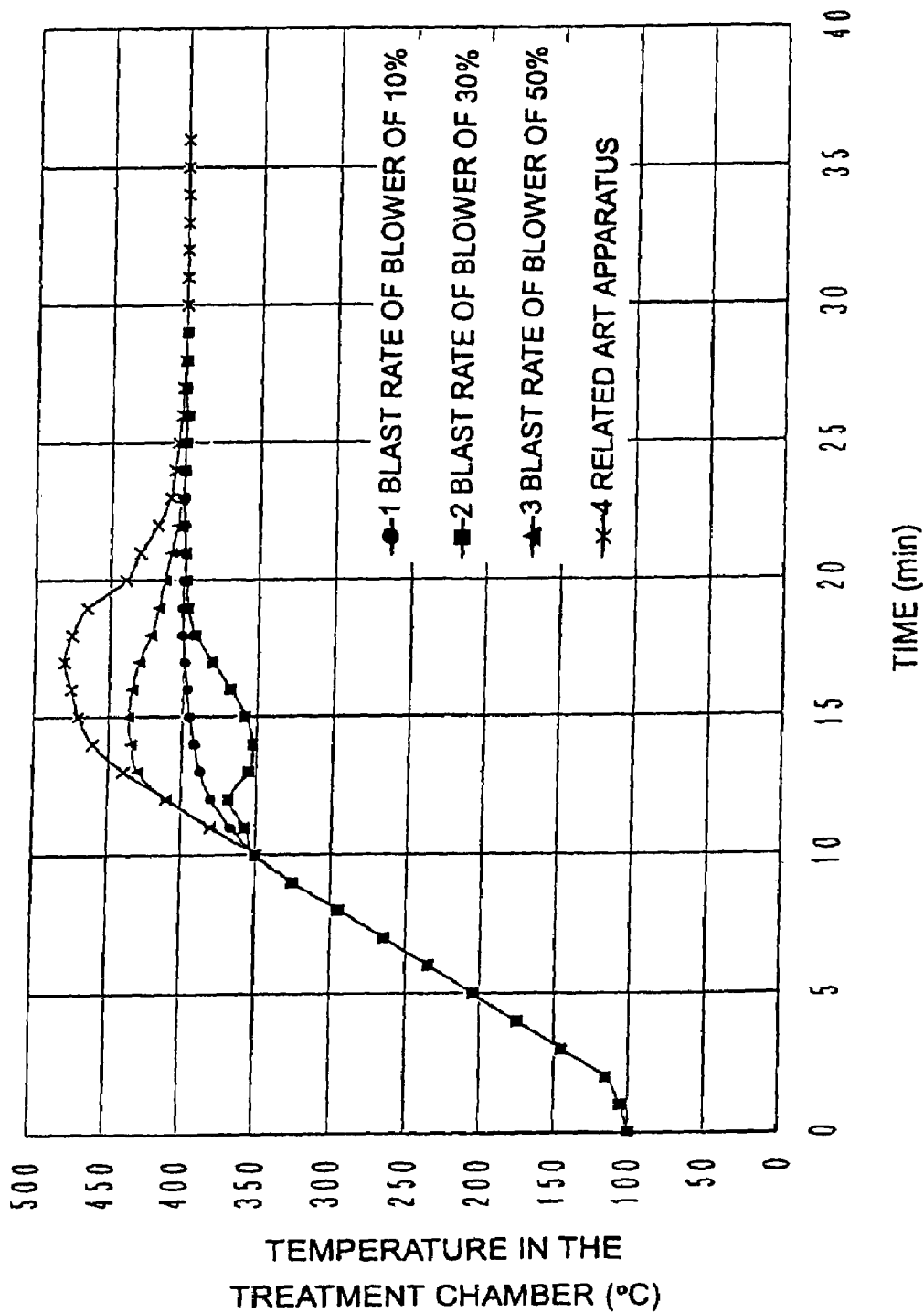
FIG. 2 is a graph showing the results of measurement of the temperature in a treatment chamber used in an example of a thermal treatment method carried out by using the thermal treatment apparatus of FIG. 1.

The results of measurement of the temperature in the treatment chamber 3 with the air of room temperature made to flow from the fluid inlet 22 into the fluid passages 8, 9 by varying an output from the blower 21 so that a blast rate of the blower 21 reaches maximum levels of 10%, 30% and 50% at a point in time at which the temperature in the treatment chamber 3 attains 350° C. while the temperature in the treatment chamber 3 is increased from 100° C. to a set level of 400° C. with the heat from the heater 6 at a temperature increasing rate of +30° C./min by using the thermal treatment apparatus 10 are shown in FIG. 2 (graphs 1 to 3).

The results of measurement of the temperature in the treatment chamber 3 in the related art apparatus were shown (graph 4) as those of a comparative example with respect to the results of measurement conducted in the embodiment. In this related art example (graph 4), the temperature in the treatment chamber 3 is increased up to 350° C. in the same manner as mentioned above, by using the thermal treatment apparatus 10 but an air blasting operation by the blower 21 is not carried out. Namely, this related art example is formed in which the cooling operation according to the present invention is not carried out.

As shown in FIG. 2, the results shown by the graph 2 of the measurement in which the cooling operations according to the present invention were carried out show that the speed of a convergence in the temperature to a set level was higher than that (graph 4) in the related art example in which the above cooling operation is not carried out.

However, when (graph 1) the blast rate was set to 10%, the cooling capacity was too low, so that the overshooting of temperature of about 10° C. occurred. When (graph 3) the blast rate was set to 50%, the cooling capacity was too high, so that the temperature once dropped and thereafter increased.

It is understood that, when (graph 2) the blast rate is set to 30%, the overshooting of temperature does not occur, and that the temperature converges to the set level simultaneously with the termination of the temperature increasing operation.

Thus, when a cooling operation is carried out additionally during a temperature increasing operation (before the termination of a temperature increasing step), the semiconductor wafers 1 do not receive an unnecessary thermal treatment. Moreover, the time needed to carry out a temperature increasing operation decreases to a greatly low level as compared with that needed in the related art method in which the temperature is increased in a stepped manner.

MODE 2 OF EMBODIMENT

Figure 3:
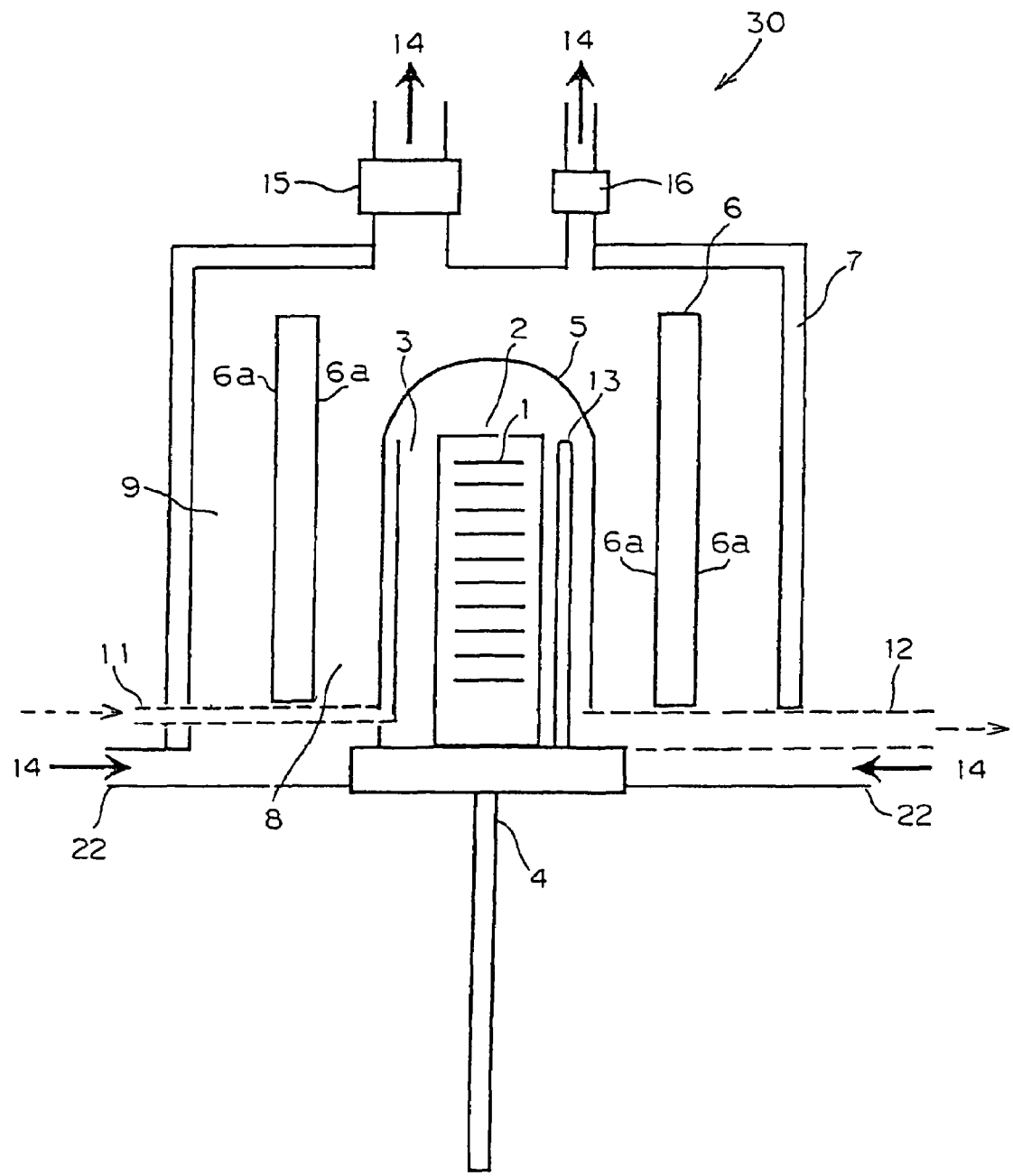
FIG. 3 is a sectional view showing the basic construction of the thermal treatment apparatus in a mode 2 of embodiment of the present invention.

FIG. 3 is a sectional view showing the basic construction of a thermal treatment apparatus in the mode 2 of the embodiment of the present invention.

The thermal treatment apparatus 10 in the mode 1 of embodiment is formed by providing one blower 21 on the downstream sides of the fluid passages 8, 9, while a thermal treatment apparatus 30 in a mode 2 of embodiment is formed by providing a first flow rate controller 15 and a second flow rate controller 16 on the downstream sides of fluid passages 8, 9 as shown in FIG. 3. Except these structures, the thermal treatment apparatus 30 has a basically identical construction as the thermal treatment apparatus 10, so that a description of the construction of each portion of the latter apparatus will be omitted.

The first and second flow rate controllers 15, 16 include a blower and a controller for controlling a blast rate of the air therefrom.

In the first flow rate controller 15, a high blast rate, a flow rate control range of which is, for example, around 5 to 100 L/MIN (liter/min) is controlled, while, in the second flow rate controller 16, a low blast rate, a flow rate control range of which is, for example, around 500 SCM ($cm^3$/min) to 10 L/MIN is controlled.

The positions of the first and second flow rate controllers 15, 16 may be on the upstream sides of the fluid passages 8, 9, i.e. in the vicinity of a fluid inlet 22.

In the thermal treatment apparatus 30 in the mode 2 of embodiment, two, i.e. large and small controllers 15, 16 having different flow rate control ranges are provided, so that a finer flow rate control operation can be carried out.

Figure 4:
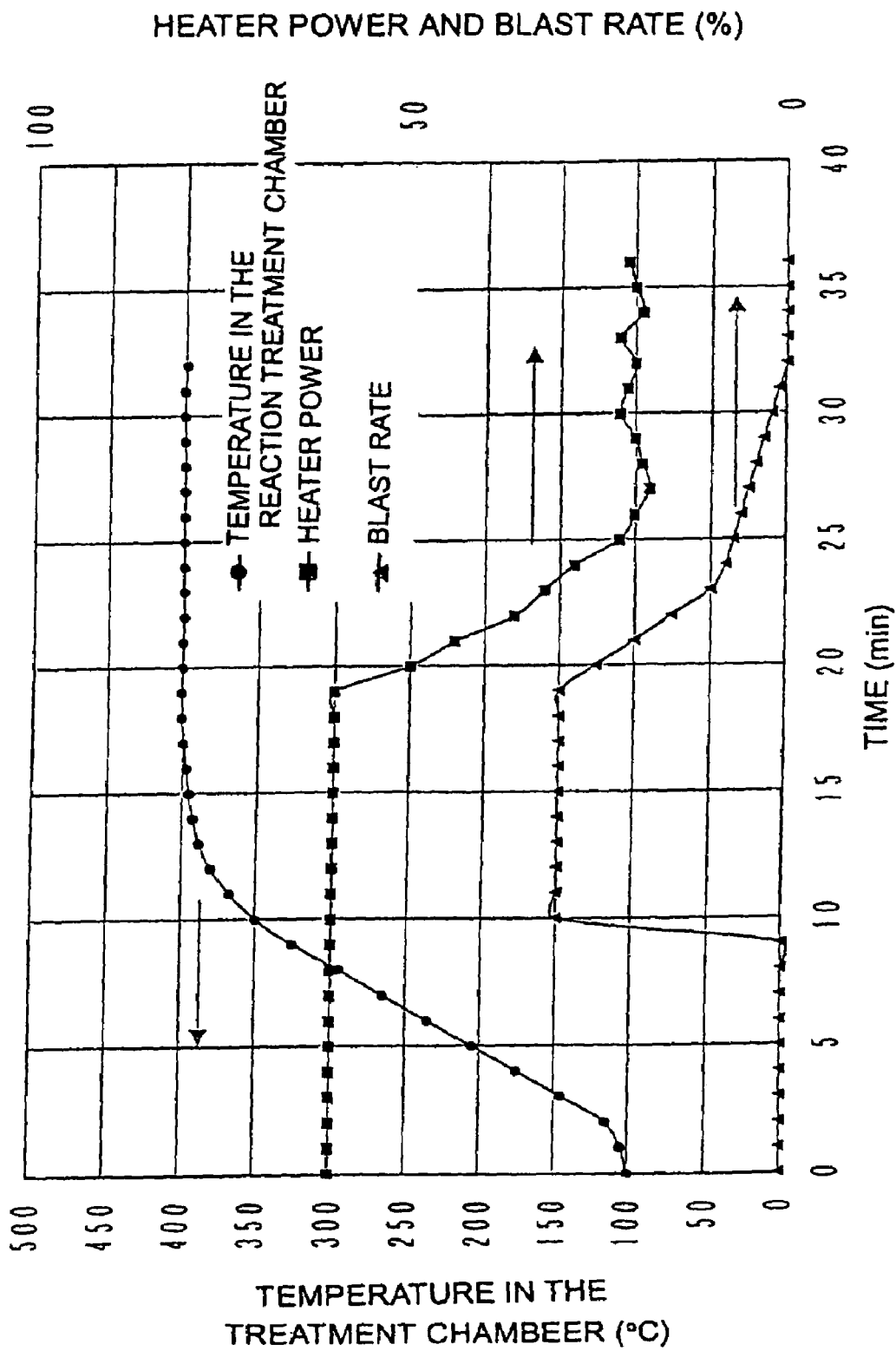
FIG. 4 is a graph showing the results of measurement of the temperature in a treatment chamber used in an example of a thermal treatment method carried out by using the thermal treatment apparatus of FIG. 3.

The results of measurement of the temperature in a treatment chamber 3 obtained in the thermal treatment apparatus 30 when the air of room temperature was made to flow from the fluid inlet 22 into the fluid passages 8, 9 with the power of a heater 6 and the blast rate of the first and second flow rate controllers 15, 16 varied are shown in FIG. 4. The blast rate shown in the drawing is expressed in terms of percentage based on 100 L/NIN as 100%.

While the temperature in the treatment chamber 3 in this example was increased from 100° C. to a set level of 400° C. at a rate of increase in the temperature of +30° C./min by the heat from the heater 6, the first flow rate controller 15 was driven at 30 L/MIN at a point in time at which the temperature in the treatment chamber 3 reached 350° C. After the temperature in the treatment chamber 3 exceeded 350° C. and then converged to a set level, the blast rate of the first flow rate controller 15 was reduced gradually. When the blast rate attained 10 L/MIN, the first flow rate controller 15 was switched to the second flow rate controller 16. The flow rate was further reduced gradually, and the power of the heater 6 was reduced gradually in accordance with a decrease in the blast rate.

The temperature in the treatment chamber 3 varies in substantially the same manner as in the case where the blast rate is 30% as shown in the graph 2 in FIG. 2. However, since the power of the heater 6 is also lowered as the cooling capacity, i.e. the blast rate is reduced, the wasteful consumption of energy can be reduced.

MODE 3 OF EMBODIMENT

Figure 5:
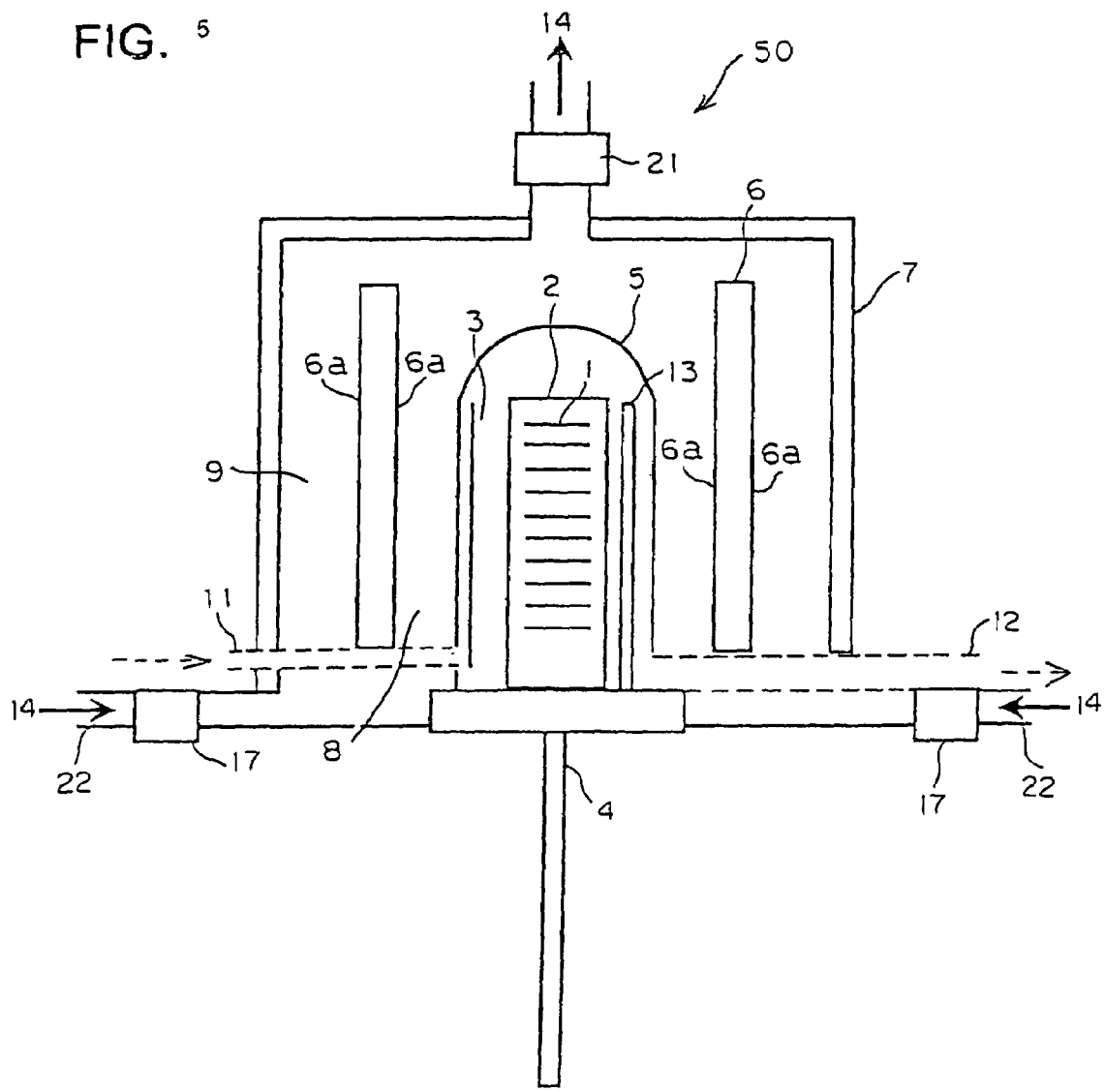
FIG. 5 is a sectional view showing the basic construction of the thermal treatment apparatus in a mode 3 of embodiment of the present invention.

FIG. 5 is a sectional view showing the basic construction of a thermal treatment apparatus in a mode 3 of embodiment of the present invention.

A thermal treatment apparatus 50 in a mode 3 of embodiment is formed by providing a second heater 17 in fluid inlets 22 of the thermal treatment apparatus 10 as in the mode 1 of embodiment. Except this structure, the thermal treatment apparatus 50 has construction basically identical with that of the thermal treatment apparatus 10, so that a description of each portion of the apparatus 50 will be omitted.

Figure 6:
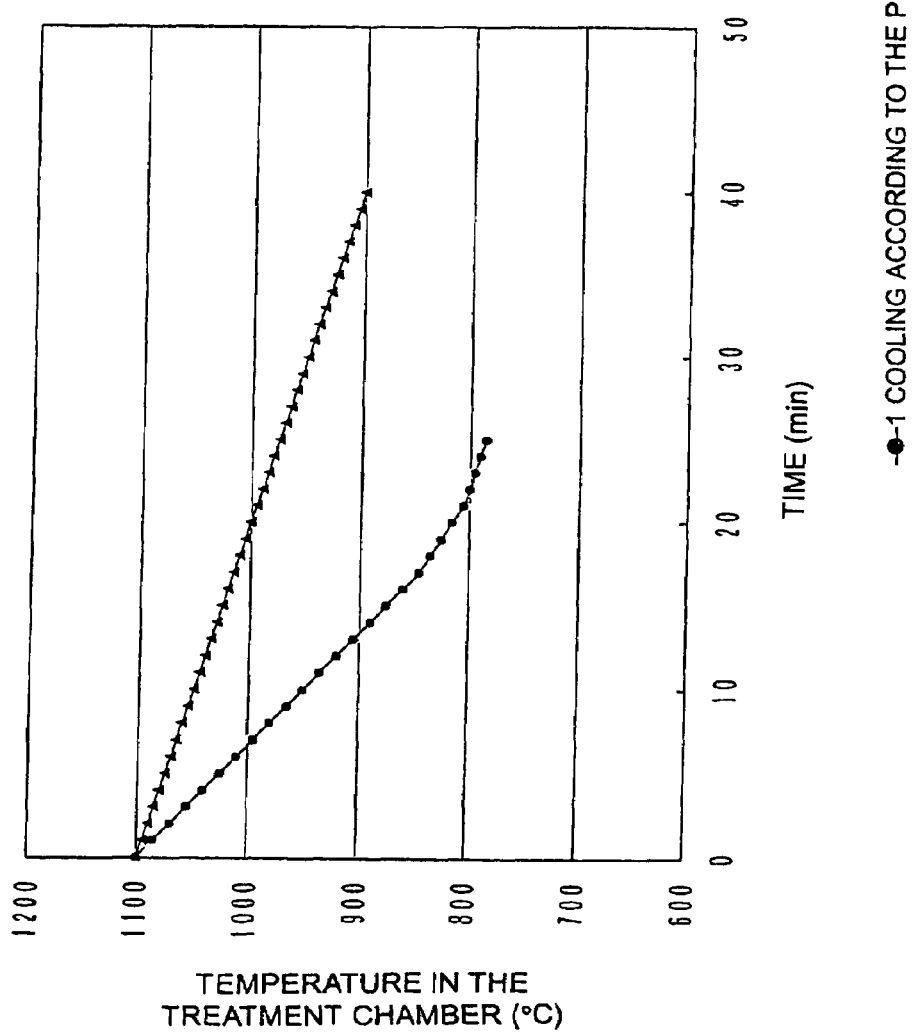
FIG. 6 is a graph showing the results of measurement of the temperature in a treatment chamber used in an example of a treatment method carried out by using the thermal treatment of FIG. 5.

The results of measurement of the temperature in a treatment chamber 3 which are obtained in the thermal treatment apparatus 50 used in which the air heated to 750° C. by the second heater 17 is made to flow from fluid inlets 22 into fluid passages 8, 9 when the temperature in the treatment chamber 3 reaching 1100° C. owing to the driving of a heater 6 is reduced by stopping the driving of the heater 6 are shown as a graph 1 in FIG. 6.

The results of measurement of the temperature in the treatment chamber 3 which are obtained when the treatment chamber 3 is left as it is to wait for the same temperature to lower naturally without carrying out the cooling operation mentioned above according to the present invention, i.e. a forcible cooling operation by a blast are shown as a graph 2 in FIG. 6.

When (graph 2) the temperature in the treatment chamber was reduced in this example by a natural cooling operation as in the related art thermal treatment apparatus, the rate of decrease in temperature was around −5° C./min, while, when (graph 1) the cooling operation according to the present invention was carried out, a rate of decrease in temperature of around −15°/min could be obtained.

The reason why the temperature of the fluid made to flow into the fluid passages 8, 9 during the above-mentioned cooling operation was set to 750° C. resides in that, when the temperature in the treatment chamber 3 is set to a lower level (for example, a fluid temperature different from the temperature in the treatment chamber 3 by not lower than 500° C.), damage is done to each portion of the thermal treatment apparatus 50 due to a sudden temperature variation, such damage having to be prevented.

MODE 4 OF EMBODIMENT

Figure 7:
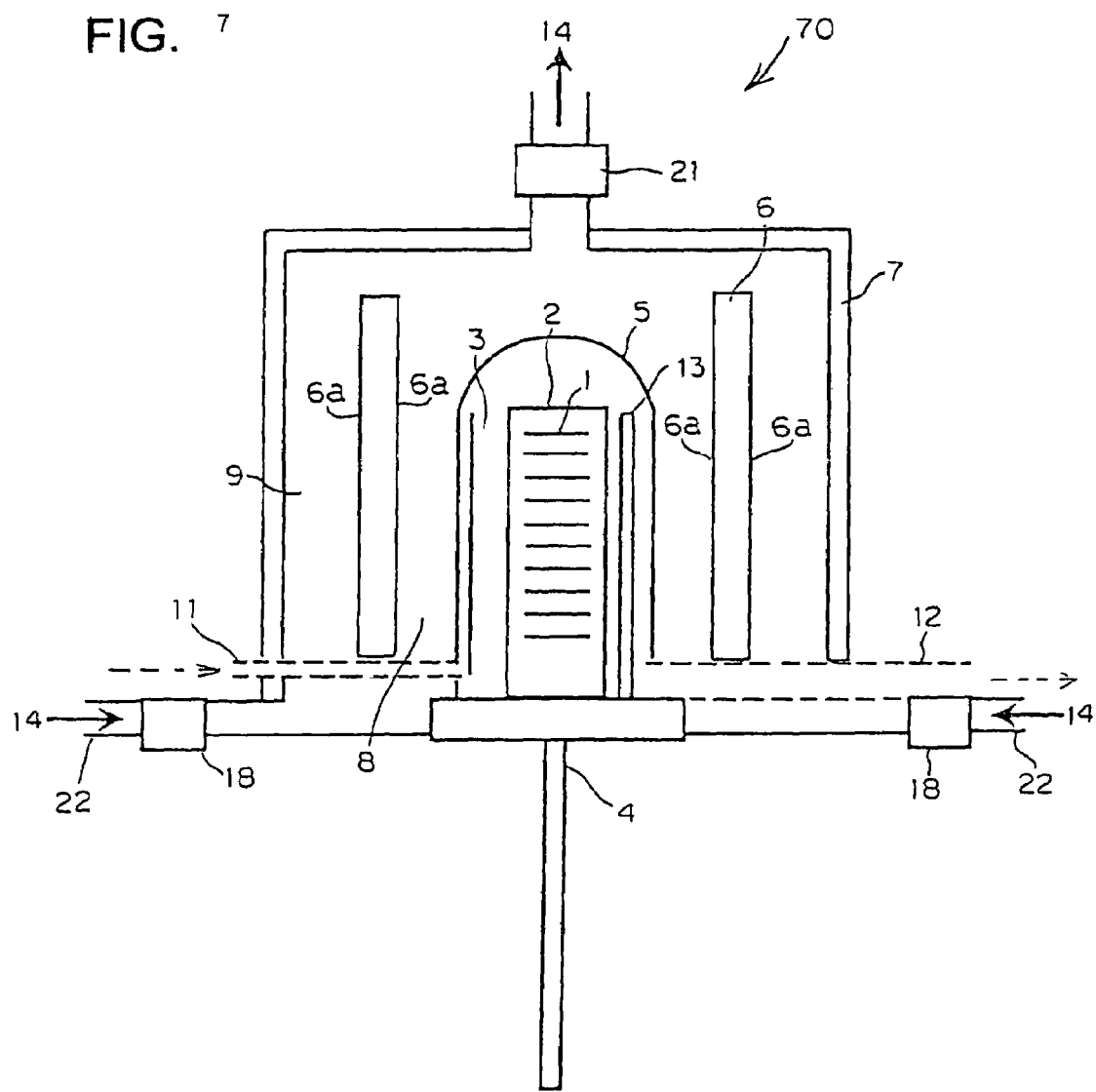
FIG. 7 is a sectional view showing the basic construction of the thermal treatment apparatus in a mode 4 of embodiment of the present invention.

FIG. 7 is a sectional view showing the basic construction of a thermal treatment apparatus in a mode 4 of embodiment of the present invention.

A thermal treatment apparatus 70 in the mode 4 of embodiment is formed by providing coolers 18 in the same fluid inlets 22 in the thermal treatment apparatus 10 as in the mode 1 of embodiment. Except this structure, the thermal treatment apparatus 70 has the basically same construction as the thermal treatment apparatus 10. Therefore, a description of each portion of the apparatus 70 will be omitted.

Figure 8:
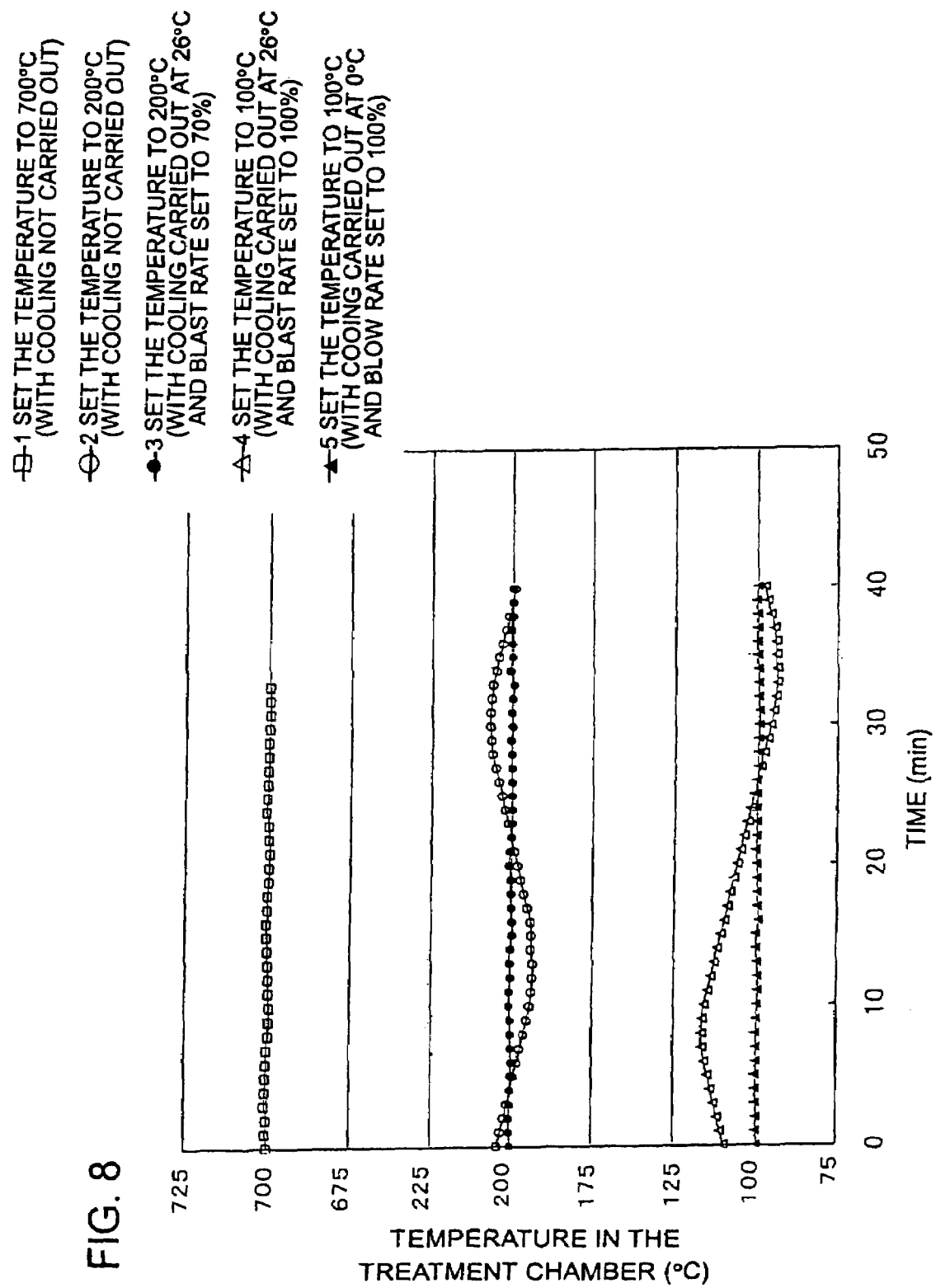
FIG. 8 is a graph showing the results of measurement of the temperature in a treatment chamber used in an example of a treatment method carried out by using the thermal treatment apparatus of FIG. 7.

The results of measurement of the temperature in the treatment chamber 3 which are obtained when the temperature in the treatment chamber 3 in the thermal treatment apparatus 70 used was set to 100° C., 200° C. and 700° C. and controlled are shown (graphs 1 to 5) in FIG. 8.

In this example, a heater 6 in use was a high-temperature heater.

At the set temperature of 700° C., a related art temperature control operation based on only the ON-OFF controlling of the heater 6 was carried out (graph 1) without conducting the cooling operation according to the present invention, i.e. a cooling operation for making a fluid pass through fluid passages 8, 9.

With respect to the set temperature of 200° C., the results of a case (graph 2) where a related art temperature control operation based on only the ON-OFF controlling of the heater 6 was carried out, and those of a case (graph 3) where the inside-chamber air (26° C.) [which will hereinafter be called outside air] was made to flow as a cooling operation according to the present invention in addition to the related art temperature control operation, from fluid inlets 22 into the fluid passages 8, 9 with a blast rate of the blower 21 set to 70% are shown.

With respect to the set temperature of 100° C., the results of a case (graph 4) where the outside air (26° C.) was made to flow as the cooling operation according to the present invention in addition to the ON-OFF controlling of the heater 6, from the fluid inlets 22 into the fluid passages 8, 9 with the blast rate of the blower 21 set to 100%, and those of a case (graph 5) where the outside air (26° C.) taken from the fluid inlets 22 was cooled as a temperature regulating cooling operation according to the present invention in addition to the ON-OFF controlling of the heater 6, to 0° C. by the cooler 18 and made to flow into the fluid passages 8, 9 with the blast rate of the blower 21 set to 100% are shown.

As shown in FIG. 8, at the set temperature of 700° C., the temperature in the treatment chamber 3 was stabilized (graph 1) by only the ON-OFF controlling of the heater 6 but, at the set temperature of 200° C., a deflection of temperature of not lower than +−5° C. occurred (graph 2).

One of the causes of the occurrence of such a deflection of temperature resides in the following. When the temperature in the treatment chamber 3 becomes high with respect to the set temperature, the temperature in the high-temperature treatment chamber 3 drops speedily due to a large difference between the temperature of the interior of the treatment chamber 3 and that of the outside air. However, when the temperature in the treatment chamber 3 is low, it takes much time to effect the natural cooling of the interior of the treatment chamber 3 due to a small difference between the temperature of the interior of the treatment chamber 3 and that of the outside air.

The other of the above-mentioned causes resides in the following. Since the heater 6 is of high-temperature specifications, the temperature in the treatment chamber 3 fluctuates greatly when an output from the heater deflects only slightly. Therefore, when the difference between the temperature in the treatment chamber 3 and that of the outside air is set large, it is considered that the temperature in the treatment chamber 3 is stabilized even when the set temperature is as low as around 100° C.

The results of an experimental example carried out on the basis of this idea, in which the cooling operation according to the present invention was carried out, were obtained as shown as the graph 3 of FIG. 8.

As the graph 3 of FIG. 8 shows, the deflection of the temperature stays within +−1° C., and the stability of the temperature in the treatment chamber 3 becomes excellent as compared with that of the temperature in the treatment chamber 3 in a case where the cooling operation according to the present invention is not carried out.

In the case where the cooling operation was carried out with the outside air taken in, the results in which case were obtained as the graph 4 of FIG. 8, a temperature drop based on the above-mentioned cooling operation is small. Therefore, the deflection of the temperature became not smaller than +−10° C., and the stability of the temperature in the treatment chamber 3 was not good.

In the temperature control operation, the results of which were obtained as the graph 5 of FIG. 8, carried out with the cooled outside air (0° C.), the deflection of the temperature stayed within +−1° C., and the stability of the temperature in the treatment chamber 3 was improved greatly as compared with that of the same temperature in the case of the graph 4.

MODE 5 OF EMBODIMENT

In a mode 5 of embodiment, the cooling operation according to the present invention was carried out in the thermal treatment apparatus 10 by varying the power of a blower 21 in accordance with the temperature in the treatment chamber 3 while monitoring the temperature in the treatment chamber 3 by a thermocouple 13 provided therein.

In this example, the temperature in the treatment chamber 3 was set to 400° C., and the temperature which became 100° C. in this chamber 3 was increased up to the set level of 400° C. at a rate of increase in temperature of +30° C./min and maintained at this level.

The power of a blower 21 was set so that a blast rate thereof becomes 30% of a maximum blast rate as described in the Mode 1 of Embodiment by using FIG. 2.

Figure 9:
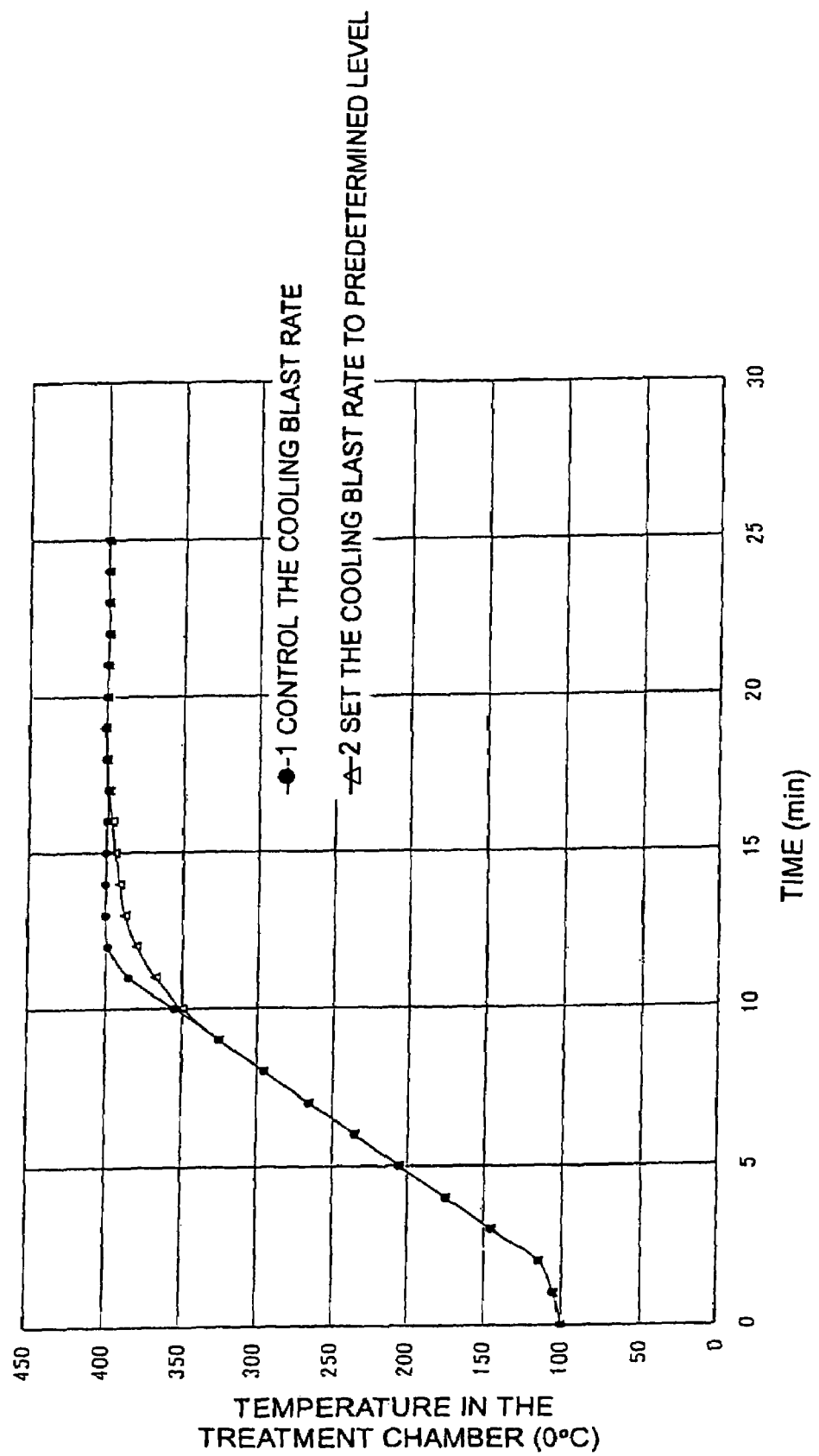
FIG. 9 is a graph showing the results of measurement of the temperature in a treatment chamber used in an example of a thermal treatment method carried out by using the thermal treatment apparatus of FIG. 1.
Figure 10:
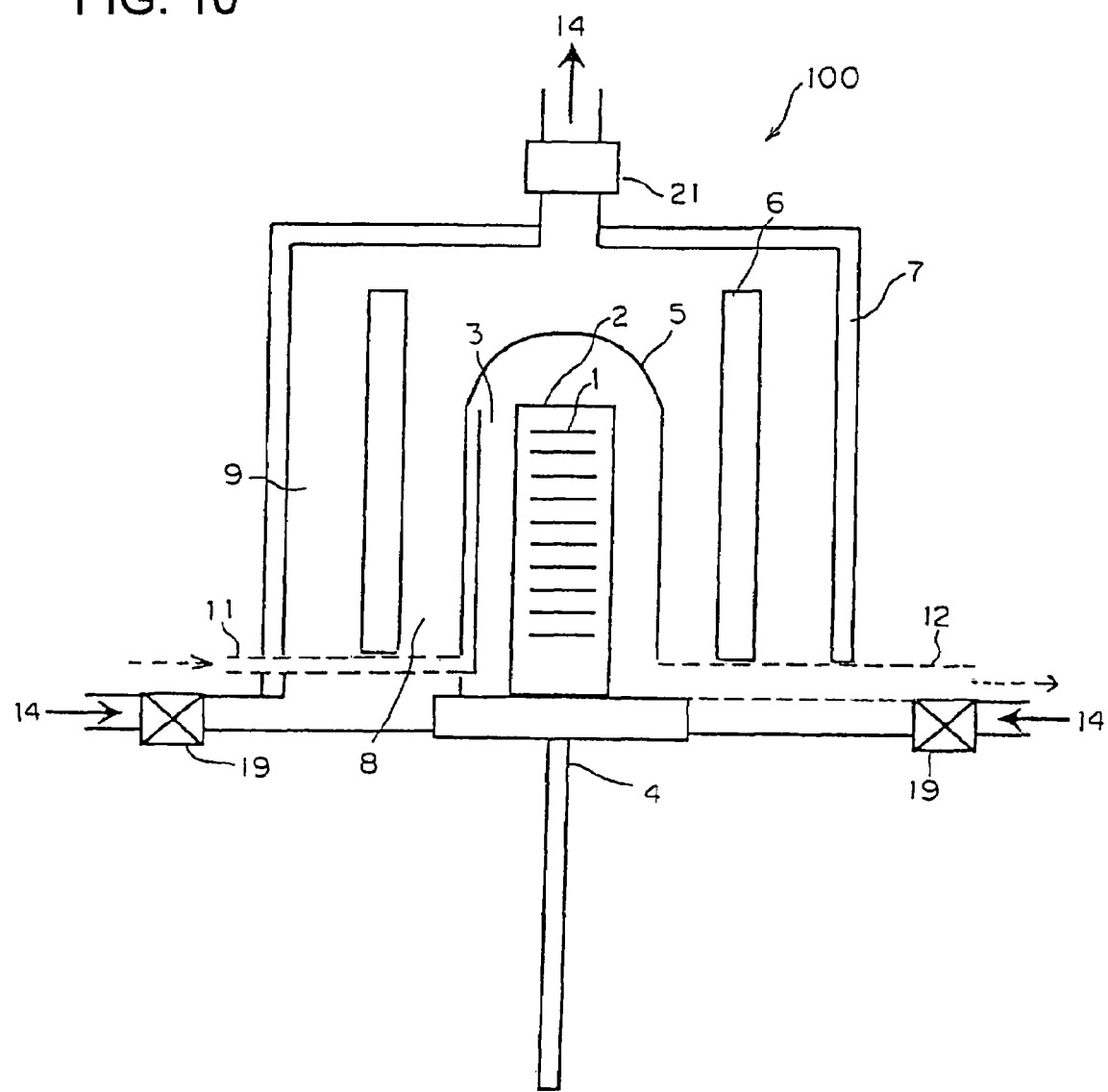
FIG. 10 is a sectional view showing the basic construction of a related art thermal treatment apparatus.
Figure 11:
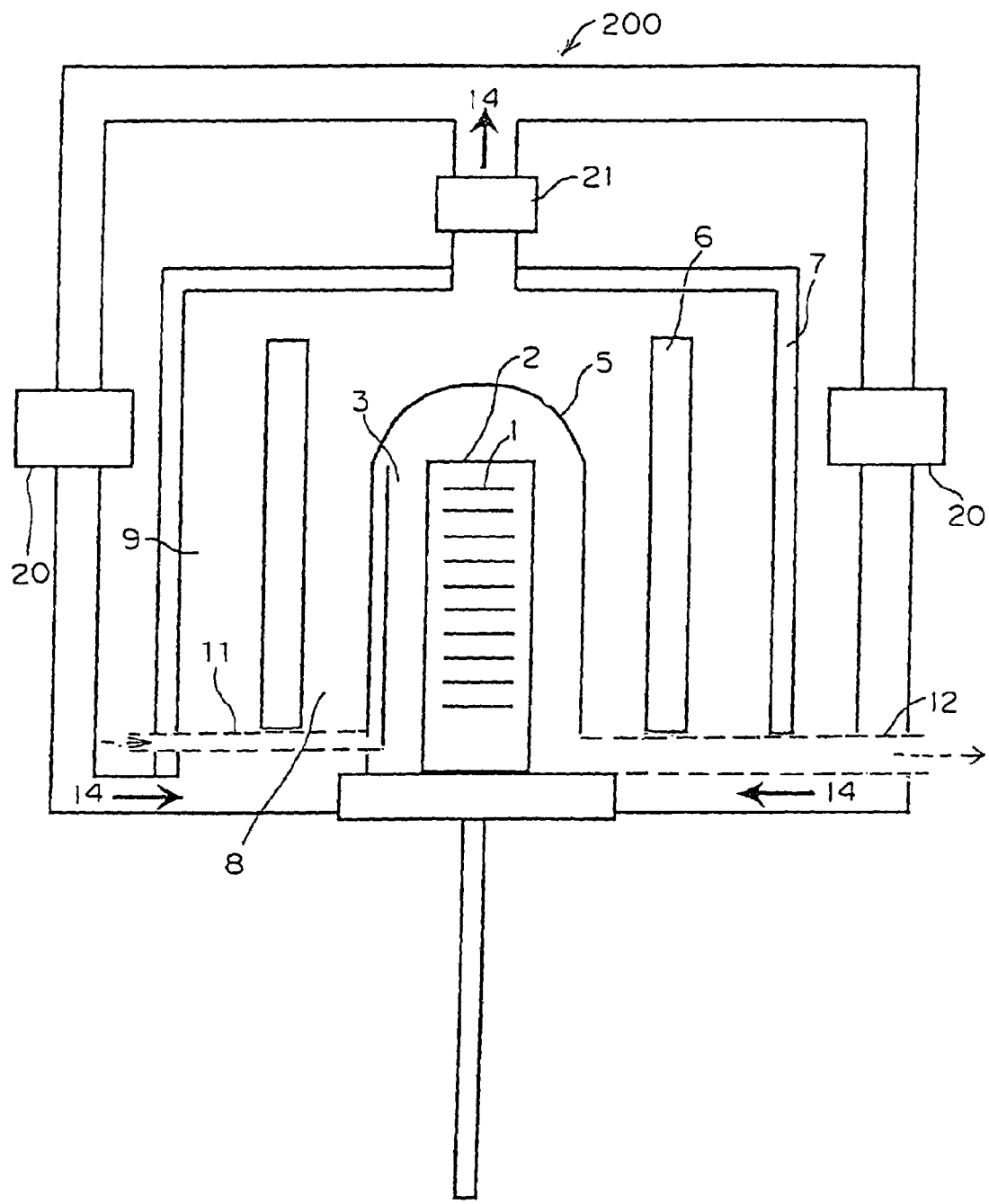
FIG. 11 is a sectional view showing the basic construction of a related art thermal treatment apparatus.
Figure 12:
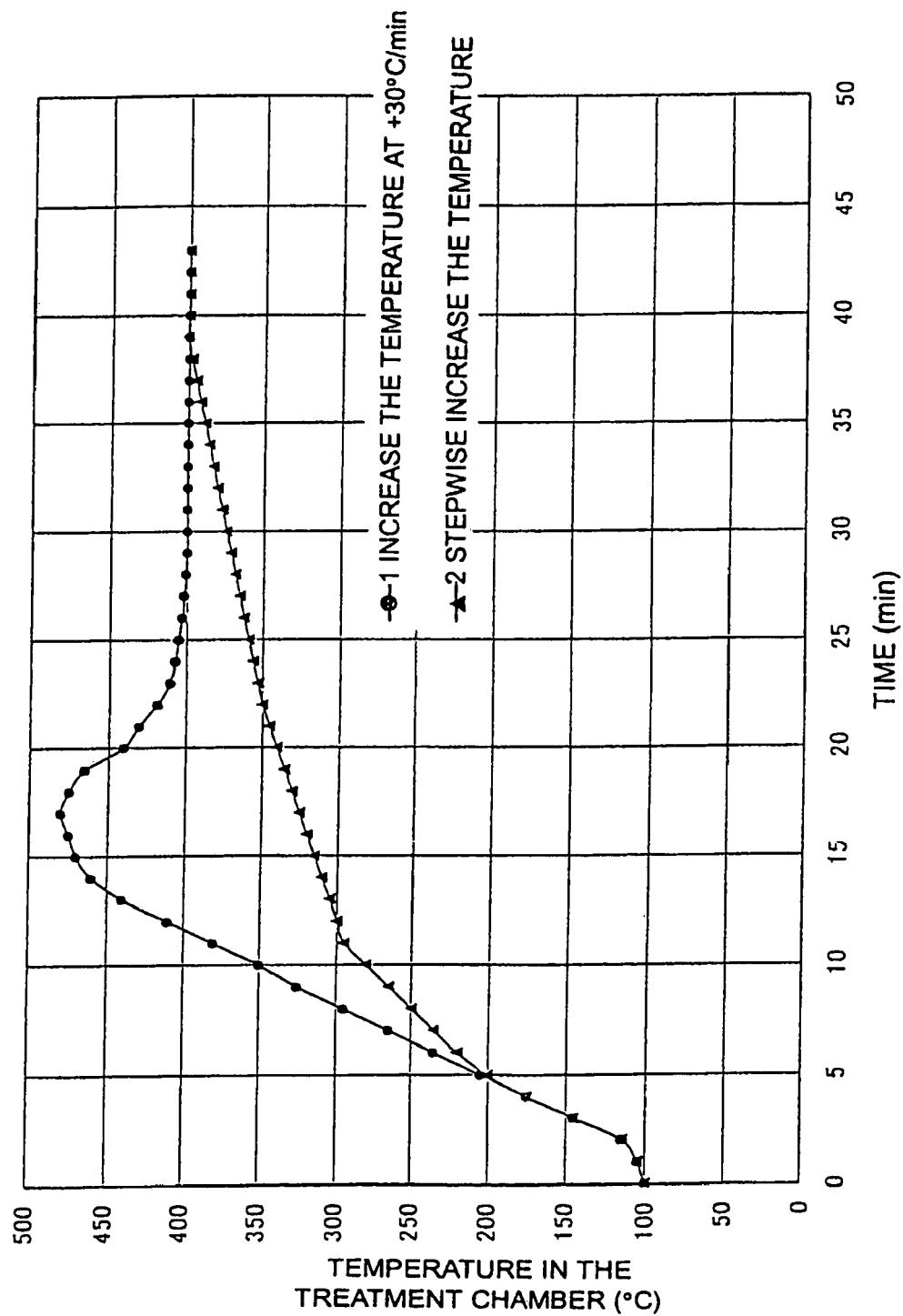
FIG. 12 is a graph showing the results of measurement of the temperature in a treatment chamber used in an example of a thermal treatment method carried out by using the related art thermal treatment apparatus.
Figure 13:
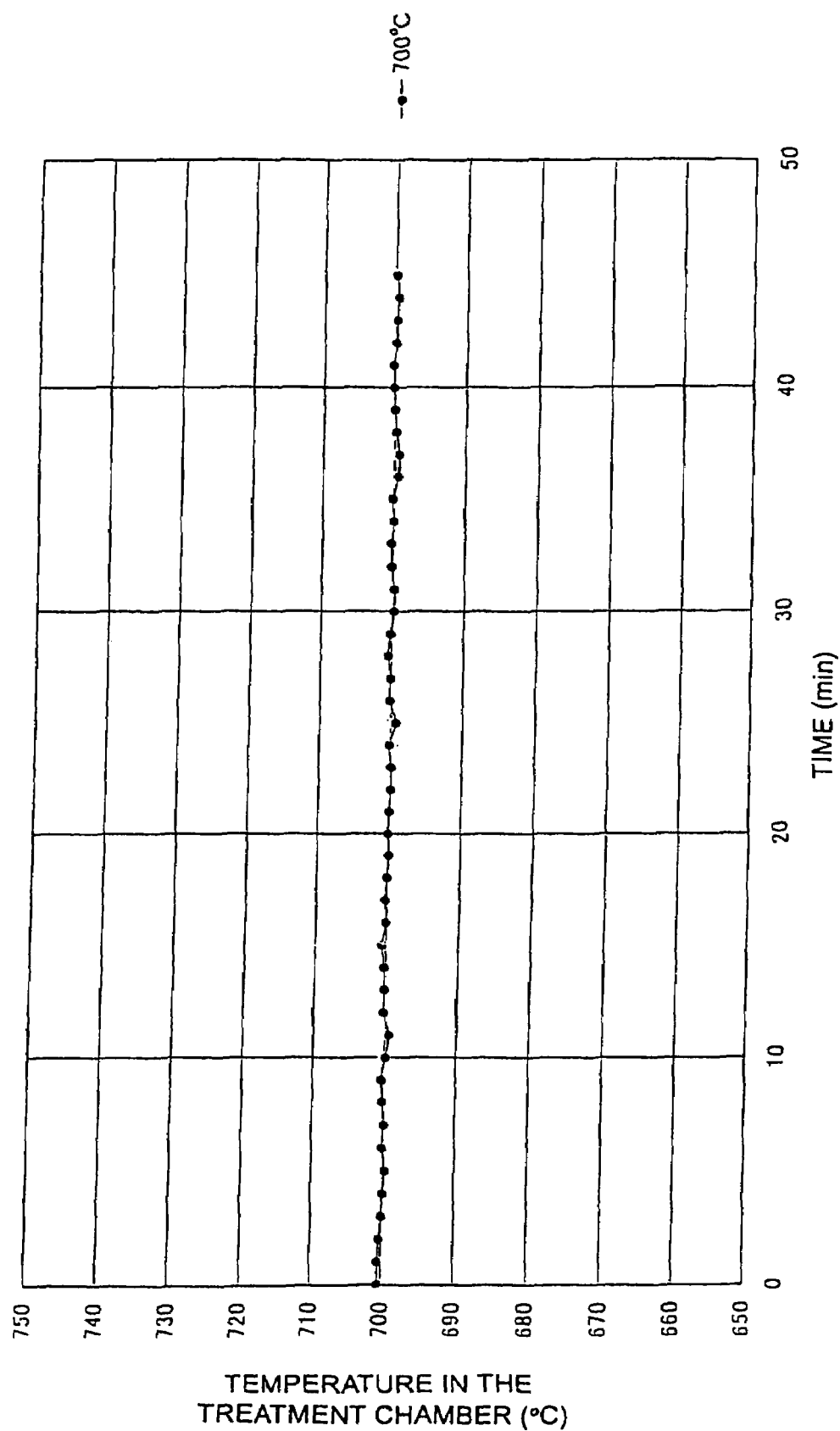
FIG. 13 is a graph showing the results of measurement of the temperature in a treatment chamber used in an example of a thermal treatment method carried out by using the related art thermal treatment apparatus.
Figure 14:
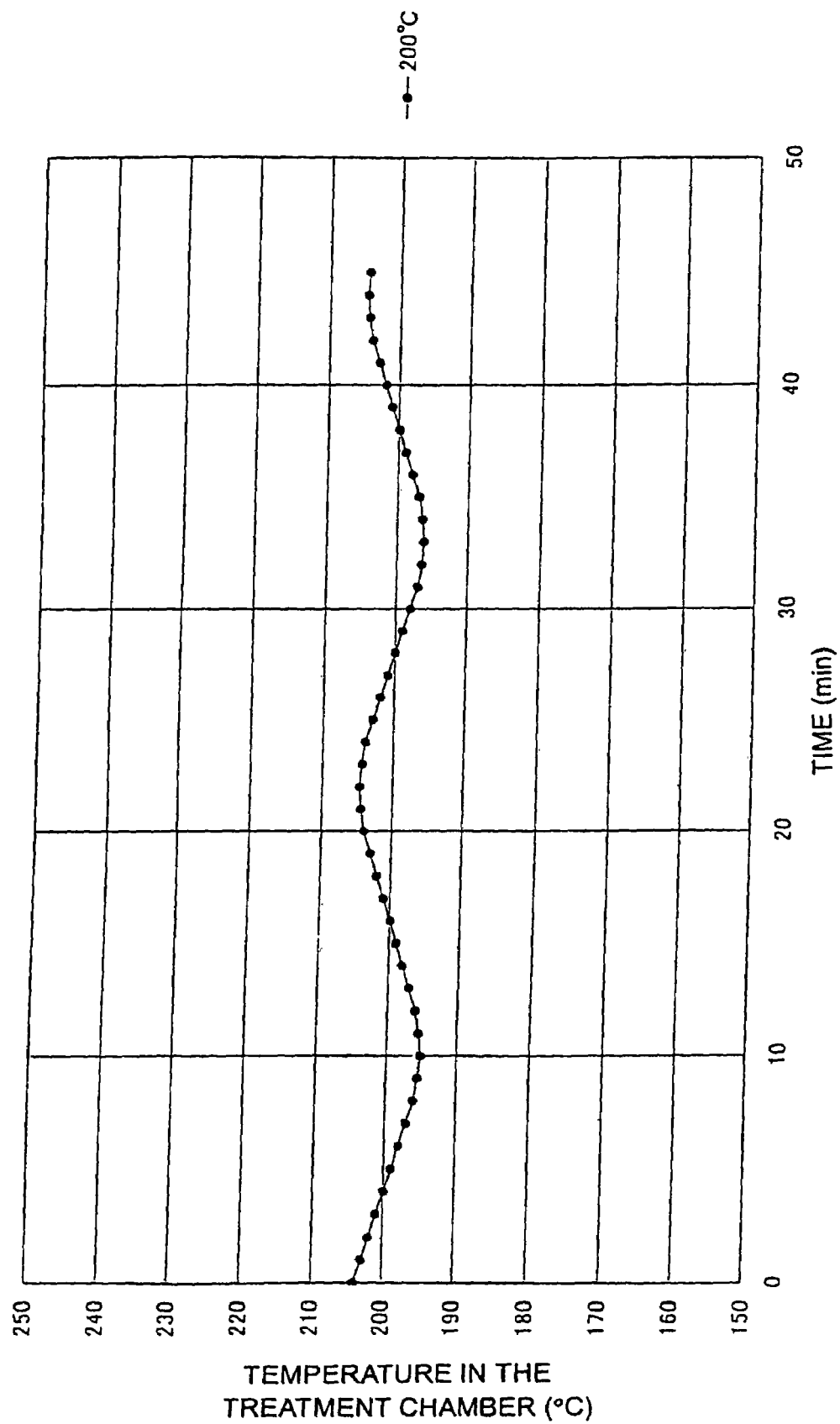
FIG. 14 is a graph showing the results of measurement of the temperature in a treatment chamber used in an example of a thermal treatment method carried out by using the related art thermal treatment apparatus.

The results of measurement of the temperature in the treatment chamber 3 the controlling of the temperature in which was done on the basis of the mode 5 of embodiment were shown in FIG. 9 (graphs 1 and 2).

The graph 2 of FIG. 9 shows the results of measurement of the temperature in the treatment chamber 3 in which a related art temperature control operation was carried out by maintaining the power of the blower 21 at a predetermined level while ON-OFF controlling a heater 6.

In the temperature controlling operation according to the present invention, the power of the blower 21 is automatically varied (graph 1) as the temperature in the treatment chamber 3 is monitored by the thermocouple 13. In this temperature control operation, the rate of increase in temperature is not substantially lowered even in a final stage of a temperature increasing operation as compared with that in a case where the power of the blower 21 is not varied (graph 2). Moreover, the overshooting of the temperature stays within +1° C., and the time necessary for the temperature to be converged to a set level is shortened.

Although the air is used as the fluid in each of the above modes of embodiments, various kinds of gases and liquids of different specific heat and the like can be used as the fluid in accordance with the condition of the heat treatment operation. Especially, when it is desired that the cooling effect be heightened, it is preferable to use a liquid, such as water.

INDUSTRIAL APPLICABILITY

In the thermal treatment apparatus according to the present invention, the rates of increasing and decreasing (i.e. cooling) the temperature can be heightened while a thermal treatment operation is carried out by a heating means in at least one period of time in the thermal treatment operation owing to the above-mentioned structure provided with a fluid control means for controlling the temperature and flow rate of the fluid made to pass through the fluid passages. Also, the heat transmitted from the heating means can be finely regulated. Therefore, the thermal treatment temperature decreases to a set level speedily, and a high temperature-stability can be obtained in a wide treatment range. This enables the through-put of the apparatus to be improved.

When the interior of the treatment chamber is cooled from the high-temperature condition to the intermediate temperature condition, the fluid is controlled so that a sudden temperature variation does not occur in the treatment chamber. Therefore, the treatment chamber is not broken.

According to the present invention, the cooling rate can be heightened, especially, from an intermediate temperature, and the cooling operation from a high temperature to an intermediate temperature can be carried out smoothly, so that the breaking of the treatment chamber can be prevented reliably.

Since the overshooting of the thermal treatment temperature can be suppressed, the consistency of the operation of the actual device with a simulation is excellent, and the productivity and quality of an object material are improved. Furthermore, since the temperature can be stabilized even at a low temperature, the quality of an object material, such as a semiconductor apparatus is improved.

A thermal treatment operation of a high temperature to a low temperature can be carried out by one apparatus, and, therefore, the plant and equipment investment can be minimized.

What is claimed is:

1. A thermal treatment apparatus providing a treatment chamber used to thermally treat an object material held therein, fluid passages formed so as to extend along an outer surface of the treatment chamber, a heating means for the thermal treatment operation placed in the fluid passages, a fluid passing means for passing a fluid through the fluid passages while bringing the fluid into contact with heating surfaces of the heating means, and a control means for controlling the temperature and flow rate of the fluid passing through the fluid passages in at least one period of time during the thermal treatment operation, said fluid passing means comprising a plurality of blast rate variable fans arranged in parallel with the fluid passage and having mutually different flow rates.

2. A thermal treatment apparatus according to claim 1, wherein the control means provides a temperature regulating means for cooling or heating at upstream sides of the fluid passages the fluid passing therethrough, a flow rate control means for controlling a flow rate of the fluid passing through the fluid passages, and a fluid controller adapted to detect the temperature of the interior of the treatment chamber or object material and control the driving of the temperature regulating means and flow rate control means.

3. A thermal treatment apparatus according to claim 2, wherein the flow rate control means is flow rate control valves provided in the fluid passages.

4. A thermal treatment apparatus according to claim 1, wherein the control means has a first heating means provided in the portion of the interior of the fluid passages which is in the vicinity of the treatment chamber, and a second heating means for heating the fluid, which passes through the fluid passages, at the upstream side of the fluid passages, wherein the first heating means is able to be switched to the second heating means.

5. A thermal treatment method adapted to carry out a thermal treatment operation comprising thermal treating a an object material in a thermal treatment apparatus provided with a treatment chamber wherein said object material is held during said thermal treatment, said apparatus further comprising fluid passages formed so as to extend along an outer surface of the treatment chamber, a heating means for the thermal treatment operation placed in the fluid passages, a fluid passing means for passing a fluid through the fluid passages while bringing the fluid into contact with heating surfaces of the heating means, and a control means for controlling the heating means and fluid passing means, wherein the control means gives a command to the fluid passing means so as to pass the fluid through the fluid passages while varying the temperature and flow rate of the fluid in at least one period of time during the thermal treatment operation, said fluid passing means comprising a plurality of blast rate variable fans arranged in parallel with the fluid passage and having mutually different flow rates.

6. A thermal treatment method according to claim 5, wherein the thermal treatment operation has a temperature increasing period between the thermal treatment starting time and the time at which a treatment temperature is attained, a retention period in which a set temperature is retained in a predetermined range of levels, and a temperature decreasing period between the end of the retention period and the time of completion of the treatment, and the control means detects the temperature of the interior of the treatment chamber or the object material and thereby controls the temperature and flow rate of the fluid in at least one of these periods.

7. A thermal treatment method according to claim 5, wherein the control means gives a command to the fluid passing means so as to pass the fluid through the fluid passages immediately before a preset treatment temperature is attained.

8. A thermal treatment method according to claim 5, wherein the control means gives a command to the heating means and fluid passing means so as to increase the temperature until the time immediately before a preset thermal treatment temperature is attained, at a rate of increase in temperature of not lower than +10° C./min on an average with the overshooting of the temperature with respect to the set temperature of not higher than +10° C.

9. A thermal treatment apparatus providing a treatment chamber used to thermally treat an object material held therein, fluid passages formed so as to extend along an outer surface of the treatment chamber, a heating structure constructed and arranged so as to provide thermal treatment in the fluid passages, a fluid passing structure constructed and arranged so as to provide passage of a fluid through the fluid passages while bringing the fluid into contact with heating surfaces of the heating structure, and a control structure constructed and arranged so as to control the temperature and flow rate of the fluid passing through the fluid passages in at least one period of time during the thermal treatment operation, said fluid passing structure comprising a plurality of blast rate variable fans arranged in parallel with the fluid passage and having mutually different flow rates.

10. A thermal treatment apparatus according to claim 9, wherein the control structure comprises a temperature regulating structure constructed and arranged so as to cool or heat at upstream sides of the fluid passages the fluid passing therethrough, a flow rate control structure constructed and arranged so as to control a flow rate of the fluid passing through the fluid passages, and a fluid controller adapted to detect the temperature of the interior of the treatment chamber or object material and control the driving of the temperature regulating structure and flow rate control structure.

11. A thermal treatment apparatus according to claim 10, wherein the flow rate control structure comprises flow rate control valves provided in the fluid passages.

12. A thermal treatment apparatus according to claim 9, wherein the control structure has a first heating structure provided in the portion of the interior of the fluid passages which is in the vicinity of the treatment chamber, and a second heating structure constructed and arranged so as to heat the fluid, which passes through the fluid passages, at the upstream side of the fluid passages, wherein the first heating structure is able to be switched to the second heating structure.

13. A thermal treatment method comprising heating an object material in a thermal treatment apparatus of claim 9.

14. A thermal treatment method according to claim 13, wherein the thermal treatment comprises increasing the temperature during an increasing period, retaining the treatment temperature in a predetermined range of levels after the increasing period and during a retention period, and a temperature decreasing period between the end of the retention period and the time of completion of the treatment, said method further comprising detection of the temperature of the interior of the treatment chamber or the object material by said control structure which also controls the temperature and flow rate of the fluid in at least one of these periods.

15. A thermal treatment method according to claim 13, wherein the control structure commands the fluid passing structure such that the fluid passes through the fluid passages immediately before a preset treatment temperature is attained.

16. A thermal treatment method according to claim 13, wherein the control structure commands the heating structure and fluid passing structure such that the temperature is increased until the time immediately before a preset thermal treatment temperature is attained, at a rate of increase in temperature of not lower than +10° C./min on an average with the overshooting of the temperature with respect to the set temperature of not higher than +1° C.

\* \* \* \* \*